(12) United States Patent
Kawakubo et al.

(10) Patent No.: US 6,404,221 B1
(45) Date of Patent: Jun. 11, 2002

(54) THRESHOLD INVARIANT VOLTAGE DETECTING DEVICE

(75) Inventors: Tomohiro Kawakubo; Hiroyoshi Tomita, both of Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/526,746

(22) Filed: Mar. 16, 2000

(30) Foreign Application Priority Data

Mar. 23, 1999 (JP) .......................................... 11-078110

(51) Int. Cl.⁷ ........................ G01R 31/26; G01R 31/02; G05F 1/10
(52) U.S. Cl. ................... 324/765; 324/763; 324/158.1; 327/537; 327/427
(58) Field of Search ................................ 324/765, 763, 324/158.1; 327/427, 434, 437, 20, 26, 537

(56) References Cited

U.S. PATENT DOCUMENTS

| 4,321,489 A | * | 3/1982 | Hihuchi et al. | 327/76 |
| 5,018,107 A | * | 5/1991 | Yoshida | 365/185.23 |
| 5,289,111 A | * | 2/1994 | Tsuji | 323/314 |
| 5,517,152 A | * | 5/1996 | Miki et al. | 327/530 |
| 5,554,954 A | * | 9/1996 | Takahashi | 327/546 |
| 5,744,998 A | * | 4/1998 | Ito et al. | 327/537 |
| 6,157,246 A | * | 7/1998 | Saitou et al. | 327/540 |
| 5,886,569 A | * | 3/1999 | Mitsuishi | 327/540 |
| B14,585,955 A | * | 11/2000 | Uchida | 327/541 |
| 6,204,699 B1 | * | 3/2001 | Shimazaki | 327/72 |

FOREIGN PATENT DOCUMENTS

| EP | 0-513928 A1 | * | 5/1992 | G05F/3/22 |
| JP | 2677301 | | 7/1997 | |

* cited by examiner

Primary Examiner—N. Le
Assistant Examiner—Wasseem H. Hamdan
(74) Attorney, Agent, or Firm—Arent Fox Kintner Plotkin & Kahn

(57) ABSTRACT

A voltage detecting circuit includes a constant-voltage source, a load part including a first transistor coupled to the constant-voltage source, and a detecting part which is connected to the load part and includes a second transistor of the same type as that of the first transistor. The detecting part detects a given voltage applied thereto.

16 Claims, 10 Drawing Sheets

FIG.2
PRIOR ART

| VBB | DEEPLY BIASED | LIGHTLY BIASED |
|---|---|---|
| N1 | L | H |
| PT1 | ON | ON |
| NT1 | ON | OFF |
| PT2 | ON | OFF |
| NT2 | OFF | ON |
| vbelz | L | H |

FIG. 5

| VBB | DEEPLY BIASED | LIGHTLY BIASED |
|---|---|---|
| N1 | L | H |
| PT11 | ON | ON |
| NT11 | ON | OFF |
| NT12 | ON | ON |
| PT22 | ON | ON |
| PT21 | ON | OFF |
| NT21 | OFF | ON |
| vbelz | L | H |

THRESHOLD INVARIANT VOLTAGE DETECTING DEVICE

BACKGROUND OF THE INVENTION

1. Field of the Invention

The present invention generally relates to voltage detecting circuits, and more particularly to a voltage detecting circuit which detects the voltage of a substrate of a semiconductor integrated circuit device.

2. Description of the Related Art

A voltage detecting circuit of a semiconductor integrated circuit device detects a negative substrate voltage VBB thereof, and generates a signal vbelz for adjusting a substrate voltage generating circuit on the basis of the substrate voltage VBB detected. The substrate voltage generating circuit generates the substrate voltage VBB based on the signal vbelz.

FIG. 1 is a circuit diagram of a voltage detecting circuit. FIG. 2 shows an example of the operation of the voltage detecting circuit. FIG. 3 is a timing chart of an example of the operation of the voltage detecting circuit. A voltage detecting circuit 100 shown in FIG. 1 includes a load part 110, a detection part 120, and NOT circuits 130-1 and 130-2.

When the voltage detecting circuit 100 is supplied with a power source voltage VDD generated outside of the semiconductor integrated circuit device or a power source voltage Vii generated inside the semiconductor integrated circuit device at time t100 shown in part (A) of FIG. 3, a PMOS (P-channel Metal Oxide Semiconductor) transistor 111 of the load part 110 is turned ON, as shown in part (B) thereof. An NMOS (N-channel MOS) transistor 121 of the detection part 120 is turned OFF, as shown in part (C) of FIG. 3. Thus, the potential of a node N1 rises and reaches a high level.

When the potential of the node N1 reaches the high level, the gate of a PMOS transistor 131 of the NOT circuit 130-1 and the gate of an NMOS transistor 132 thereof are set to the high level. As shown in parts (E) and (F) of FIG. 3, the PMOS transistor 131 is turned OFF, and the NMOS transistor 132 is turned ON. Thus, as shown in part (G) of FIG. 3, the potential of a node N3 reaches a low level.

The NOT circuit 130-2 is supplied with the low level from the NOT circuit 130-1, and inverts the low level thus supplied, so that the high level is output from the NOT circuit 130-2. The signal output from the NOT circuit 130-2 shown in part (H) of FIG. 3 is used as the signal vbelz for adjusting the substrate voltage generating circuit (not shown). At time t110, the substrate voltage generating circuit starts to generate the substrate voltage VBB from the signal vbelz.

The substrate voltage generating circuit generates the negative substrate voltage VBB in response to the signal vbelz which is at the high level. Then, as shown in part (I) of FIG. 3, the substrate voltage VBB gradually decreases, and reaches, at time t120, a value defined by equation (1) shown below:

$$VBB = V_{GND} - Vth \quad (1)$$

where $V_{GND}$ is the ground potential, and Vth is the threshold voltage of the NMOS transistor 121.

When equation (1) stands (is in effect), the NMOS transistor 121 is turned ON, as shown in part (c) of FIG. 3. Thus, as shown in part (D) of FIG. 3, the node N1 switches to the low level. Then, the gate potentials of the PMOS transistor 131 and the NMOS transistor 132 of the NOT circuit 130-1 change to the low level. Thus, as shown in parts (E) and (F), the PMOS transistor 131 is turned ON, and the NMOS transistor 132 is turned OFF. Then, as shown in part (G) of FIG. 3, the potential of the node N3 changes to the high level.

The NOT circuit 130-2 inverts the high level supplied from the NOT circuit 130-1, and outputs the signal vbelz which is at the low level, as shown in part (H) of FIG. 3. In response to the low-level signal Vbelz, the substrate voltage generating circuit stops generating the negative substrate voltage VBB. Thus, as shown in part (I) of FIG. 3, the substrate voltage VBB is adjusted so that equation (1) stands.

As described above, the substrate voltage VBB is adjusted based on the potential of the node N1. FIG. 2 shows states of the transistors with respect to the substrate voltage VBB. In FIG. 2, "deeply biased" denotes that the substrate voltage VBB is greater in the negative-side direction than that defined by equation (1), and "lightly biased" denotes that VBB is greater in the positive-side direction than that defined by equation (1).

However, there is a possibility that the threshold voltages Vth of the transistors of the voltage detecting circuit shown in FIG. 1 deviate from the target value due to variations in factors involved in the process of fabricating the semiconductor integrated circuit devices. For example, in case where the threshold voltage Vth of the PMOS transistor 111 has a variation different from that of the threshold voltage Vth of the NMOS transistor 121, the variations cannot be mutually canceling at the node N1.

Thus, the operation of detecting the substrate voltage VBB is affected by variation in the threshold voltage Vth of the PMOS transistor 111, so that the substrate voltage VBB cannot be adjusted accurately. Further, the NOT circuit 130-1 is set at an intermediate level when a level transition occurs at the node N1. At this time, the PMOS transistor 131 and the NMOS transistor 132 are both ON. Thus, a pass-through current flows through the NOT circuit 130-1, and power is wastefully consumed.

SUMMARY OF THE INVENTION

It is a general object of the present invention to provide a voltage detecting circuit in which the above drawbacks are eliminated.

A more specific object of the present invention is to provide a voltage detecting circuit capable of accurately detecting the substrate voltage by reducing variations in the threshold voltages of transistors.

Another object of the present invention is to provide a voltage detecting circuit consuming a reduced amount of power.

The above objects of the present invention are achieved by a voltage detecting circuit including a constant-voltage source, a load part including a first transistor coupled to the constant-voltage source, and a detecting part which is connected to the load part and includes a second transistor of the same type as that of the first transistor. The detecting part detects a given voltage applied thereto.

BRIEF DESCRIPTION OF THE DRAWINGS

Other objects, features and advantages of the present invention will become more apparent from the following detailed description when read in conjunction with the accompanying drawings, in which:

FIG. 2 shows an operation of the voltage detecting circuit shown in FIG. 1;

FIG. 5 is a diagram showing an operation of the voltage detecting circuit shown in FIG. 4;

DESCRIPTION OF THE PREFERRED EMBODIMENTS

Figure 1:
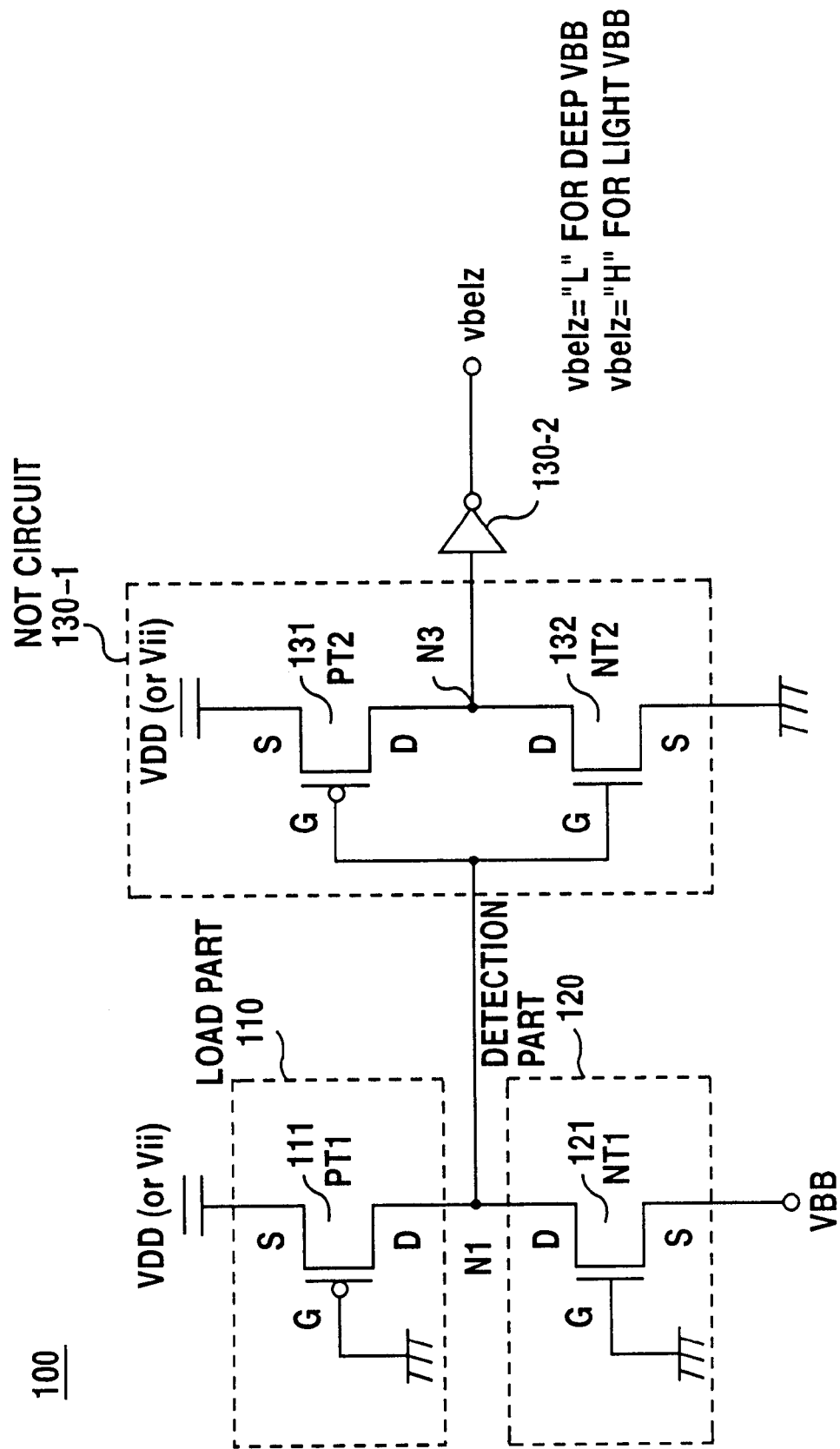
FIG. 1 is a circuit diagram of a conventional voltage detecting circuit.
Figure 3:
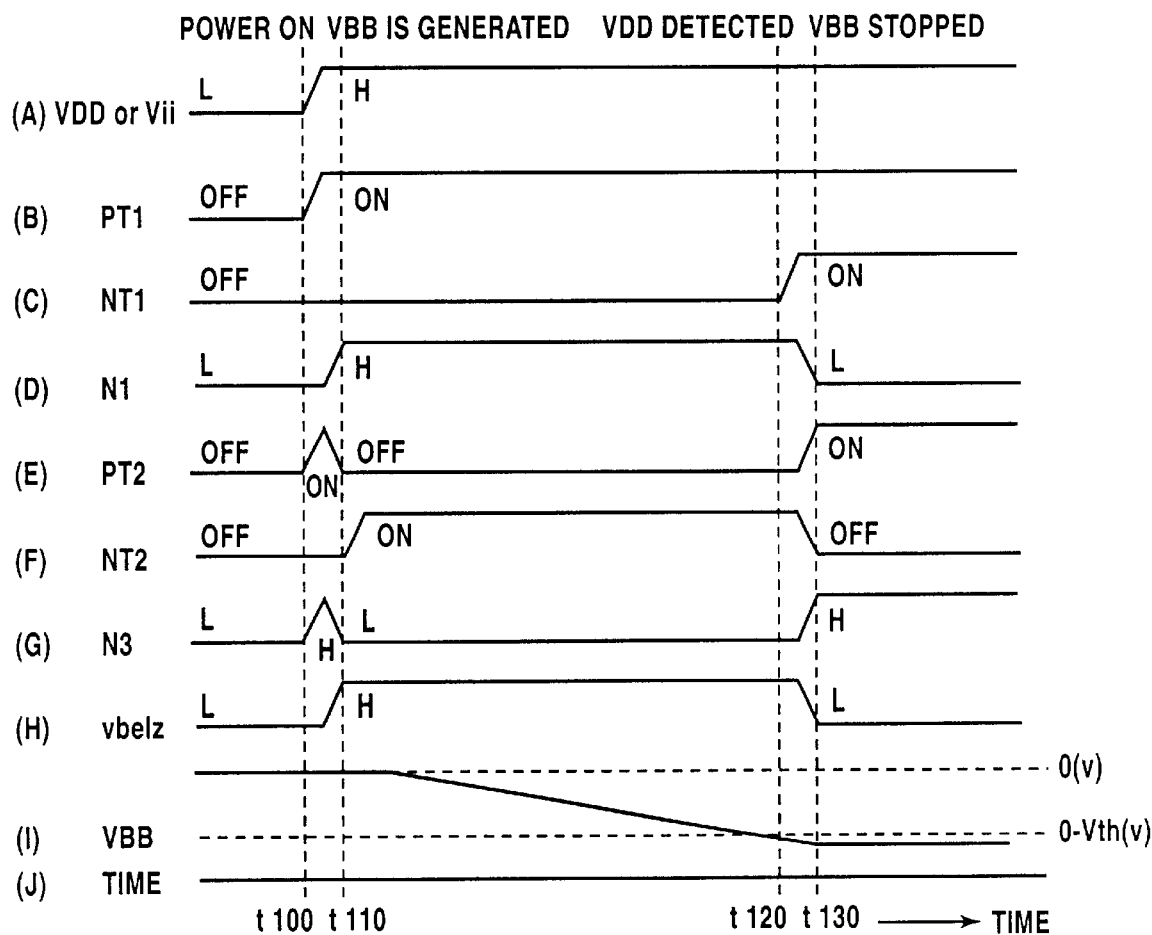
FIG. 3 is a waveform diagram of an example of the operation of the voltage detecting circuit shown in FIG. 1.
Figure 4:
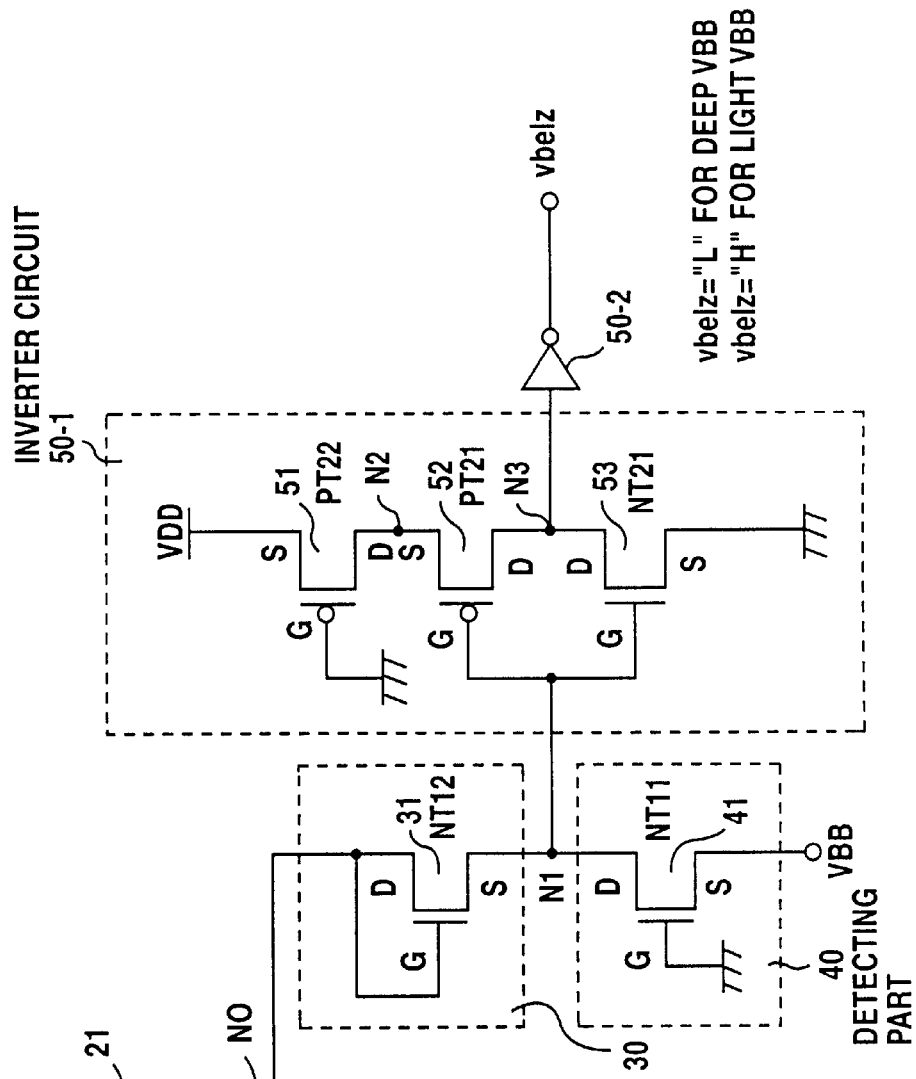
FIG. 4 is a circuit diagram of a voltage detecting circuit according to a first embodiment of the present invention.

FIG. 4 is a circuit diagram of a voltage detecting circuit 1 according to a first embodiment of the present invention. The voltage detecting circuit 1 includes a constant-voltage source 10, a voltage correcting part 20, a load part 30, a detecting part 40, and NOT circuits (inverters) 50-1 and 50-2.

The constant-voltage source 10 is made up of resistors 11 and 12, and the voltage correcting part 20 formed of a PMOS transistor 21 (PT11). The source of the PMOS transistor 21 is coupled to a power source voltage VDD via the resistor 11, and the gate (control terminal) thereof is grounded. The drain of the PMOS transistor 21 is coupled to the drain of an NMOS transistor 31 (NT12) via a node NO. The resistors 11 and 12 are used as necessary, and have resistance values depending on the relationship between the power source voltage VDD generated outside of the semiconductor integrated device and a voltage required in the voltage detecting circuit 1.

The load part 30 includes the NMOS transistor 31. The drain of the NMOS transistor 31 is connected to the node NO and gate thereof, and the source thereof is connected via a node N1 to the drain of an NMOS transistor 41 (NT11) and the gates of a PMOS transistor 52 (PT21) and an NMOS transistor 53 (NT21).

The detecting part 40 includes the NMOS transistor 41, the gate of which is grounded. The source of the NMOS transistor 41 is supplied with the substrate voltage VBB, which is to be detected by the voltage detecting circuit 1. The drain of the NMOS transistor 41 is connected to the node N1.

The NOT circuit 50-1 includes PMOS transistor 51 (PT22), the PMOS transistor 52 (PT21), and the NMOS transistor 53 (NT21). The source of the PMOS transistor 51 is connected to the power source voltage VDD, and the gate thereof is grounded. The drain of the PMOS transistor 51 is coupled to the source of the PMOS transistor 52 via a node N2.

The gate of the PMOS transistor 52 is connected to the node N1, and the drain thereof is coupled to the drain of the NMOS transistor 53 and the NOT circuit 50-2 via a node N3. The gate of the NMOS transistor 53 is connected to the node N1, and the drain thereof is connected to the node N3, while the source thereof is grounded. The NOT circuit 50-2 has the same construction as that of the NOT circuit 50-1.

The constructions of the NOT circuits 50-1 and 50-2 may be modified based on the driving voltage generated by a substrate voltage generating circuit (not shown) located on the output side of the NOT circuit part 50-2. For example, if the driving voltage of the substrate voltage generating circuit is large, a modification will be made such that an increased number of NOT circuit parts is provided so as to follow the node N1.

A description will be given, with reference to FIGS. 5 and 6, of an operation of the voltage detecting circuit shown in FIG. 4.

Figure 6:
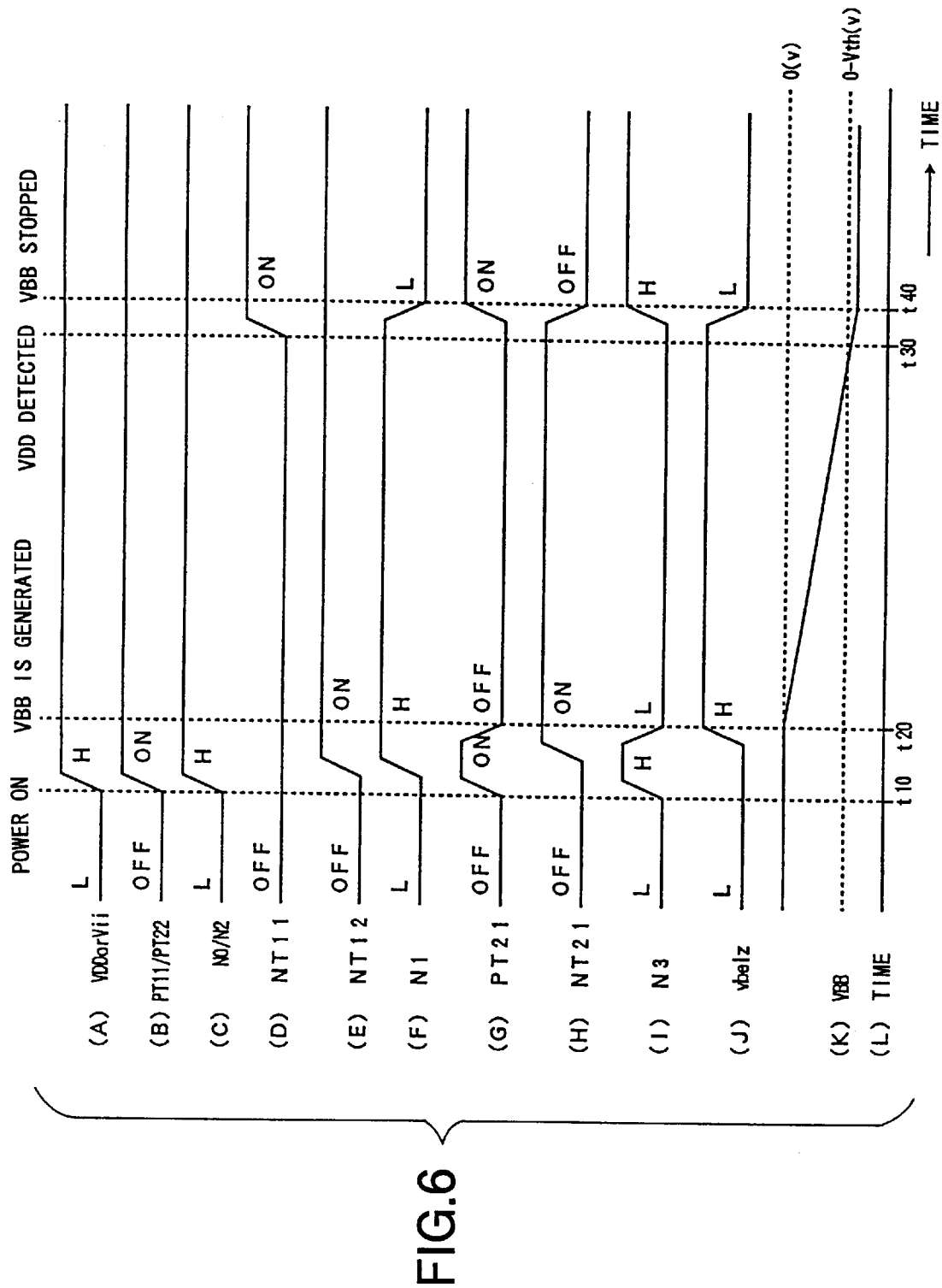
FIG. 6 is a timing chart of an operation of the voltage detecting circuit shown in FIG. 4.

When the power source voltage VDD generated outside of the semiconductor device is supplied at time t10 shown in part (A) of FIG. 6, the PMOS transistors 21 and 51 are turned ON, as shown in part (B) of FIG. 6. The PMOS transistor 21 is provided so as to correspond to the PMOS transistor 51, and functions to cancel a deviation of the threshold voltage Vth of the PMOS transistor 51 introduced during the fabricating process.

Since the PMOS transistor 21 is in the ON state, the node NO becomes a high level defined by dividing the power source voltage VDD by the resistors 11 and 12, as shown in part (c) of FIG. 6. The above high level is supplied to the drain and gate of the NMOS transistor 31 (NT12), so that the NMOS transistor 31 is turned ON, as shown in part (E) of FIG. 6. Further, as shown in part (D) of FIG. 6, the NMOS transistor 41 (NT11) is turned OFF. Thus, the potential of the node N1 increases to the high level, as shown in part (F) of FIG. 6.

It is to be noted that the voltage detecting circuit 1 is constructed so that the load part 30 and the detecting part 40 are formed of the NMOS transistors 31 and 41, respectively. Since the load part 30 and the detecting part 40 are formed of transistors of the same type (N-channel type), a deviation of the threshold voltage Vth of the NMOS transistor 41 of the detecting part 40 can be canceled by a deviation of the threshold voltage Vth of the NMOS transistor 31 of the load part 30. This utilizes the fact that the transistors of the same type within the semiconductor device have almost the same deviations.

Turning back to FIGS. 4 through 6, when the node N1 reaches the high level, the high level is applied to the gates of the PMOS transistor 52 and the NMOS transistor 53 of the NOT circuit part 50-1. Then, as shown in parts (G) and (H) of FIG. 6, the PMOS transistor 52 is turned OFF, and the NMOS transistor 53 is turned ON. Thus, the potential of the node N3 is switched to the low level, as shown in part (I) of FIG. 6.

The NOT circuit part 50-2 receives the low level from the NOT circuit part 50-1, and outputs the high level by inverting the received low level. The signal output from the NOT circuit part 50-2 shown in part (J) of FIG. 6 is the signal vbelz which adjusts the substrate voltage generating circuit (not shown). The substrate voltage generating circuit starts, from time t20, to generate the substrate voltage VBB based on the signal vbelz.

When the substrate voltage generating circuit is supplied with the signal vbelz which is at the high level, it generates the negative substrate voltage VBB. Then, as shown in part (K) of FIG. 6, the substrate voltage VBB gradually decreases, and reaches the level defined by equation (2) shown below:

$$VBB = V_{GND} - Vth4 \qquad (2)$$

where Vth4 is the threshold voltage of the NMOS transistor 41.

When the substrate voltage VBB reaches the level defined by equation (2) at time t30, the NMOS transistor 41 is turned ON, as shown in part (D) of FIG. 6. Thus, the potential of the node N1 switches to the low level, as shown in part (F) of FIG. 6. Thus, the low level is applied to the gates of the PMOS transistor 52 and the NMOS transistor 53 of the NOT circuit part 50-1.

Thus, as shown in parts (G) and (H), the PMOS transistor 52 is turned ON, and the NMOS transistor 53 is turned OFF, so that the potential of the node N3 switches to the high level, as shown in part (I) of FIG. 6.

The NOT circuit part 50-2 inverts the high level supplied from the NOT circuit part 50-1 and thus outputs the signal vbelz which is at the low level, as shown in part (J) of FIG. 6. In response to the low-level signal vbelz, the substrate voltage generating circuit stops generating the negative substrate voltage VBB, so that the voltage VBB is thus adjusted so as to have the level defined by equation (2), as shown in part (K) of FIG. 6.

A description will now be given of the reason why the PMOS transistors 21 and 51 are provided in the constant-voltage source 10 and the NOT circuit part 50-1, respectively.

There is a case where the PMOS transistor 52 and the NMOS transistor 53 simultaneously turn ON during a period of potential transition at the node N1. In such a case, a pass-through current flows through the NOT circuit part 50-1. It is possible to reduce the pass-through current by providing the PMOS transistor 51 having a long gate length between the power source voltage VDD and the PMOS transistor 52. Thus, wasteful power consumption can be avoided.

However, the PMOS transistor 51 may cause a reduction of the level of the signal vbelz and a situation in which the potential of the node N2 in the NOT circuit part 50-1 varies in a way different from that in which the potential of the node N0 in the constant-voltage source 10 varies due to variations in some factors involved in the fabricating process.

With the above in mind, an increased number of stages of NOT circuits following the node N3 can be provided. With this structure, it is possible to ensure a sufficient level of the signal vbelz. Further, in order to cancel variations in the threshold voltage Vth of the PMOS transistor 51 caused by variations in some factors involved in the fabricating process, the PMOS transistor 21 is provided in the voltage correcting part 20 of the constant-voltage source 10. The PMOS transistor 21 makes it possible to cause the potentials of the nodes N0 and N2 to vary in the same way due to similarity in variations in some factors involved in the transistor manufacturing process.

As described above, the detection of the substrate voltage VBB is adjusted based on the potential of the node N1. FIG. 5 shows the states of the transistors with respect to the substrate voltage VBB. In FIG. 5, "deeply biased" denotes that the substrate voltage VBB is greater in the negative-side direction than that defined by equation (1), and "lightly biased" denotes that VBB is greater in the positive-side direction than that defined by equation (1).

A description will be given of voltage detecting circuits according to other embodiments of the present invention.

Figure 7:
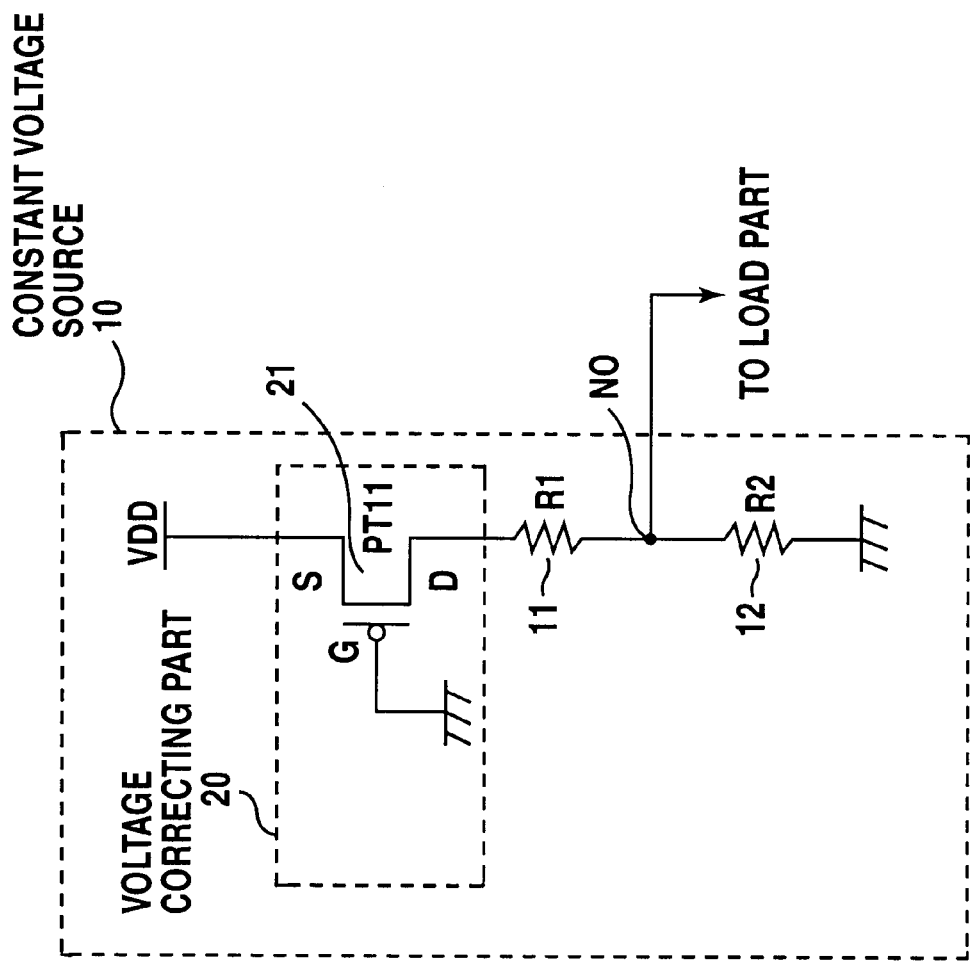
FIG. 7 is a circuit diagram of a constant-voltage source used in a voltage detecting part according to a second embodiment of the present invention.

FIG. 7 is a circuit diagram of an essential part of a voltage detecting circuit according to a second embodiment of the present invention. In FIG. 7, parts that are the same as those shown in FIG. 4 are given the same reference numbers as previously. The constant-voltage source 10 shown in FIG. 7 differs from that shown in FIG. 4 in the positions of the PMOS transistor 21 and the resistor 11. It is possible to interchange the positions of the resistor 11 and the PMOS transistor 21 forming the voltage correcting part 20 as long as the resistor 11 and the PMOS transistor 21 are interposed between the power source voltage VDD and the node NO. Except for the construction of the constant-voltage source 10, the voltage detecting circuit has the same construction as that of the voltage detecting circuit shown in FIG. 4.

Figure 8:
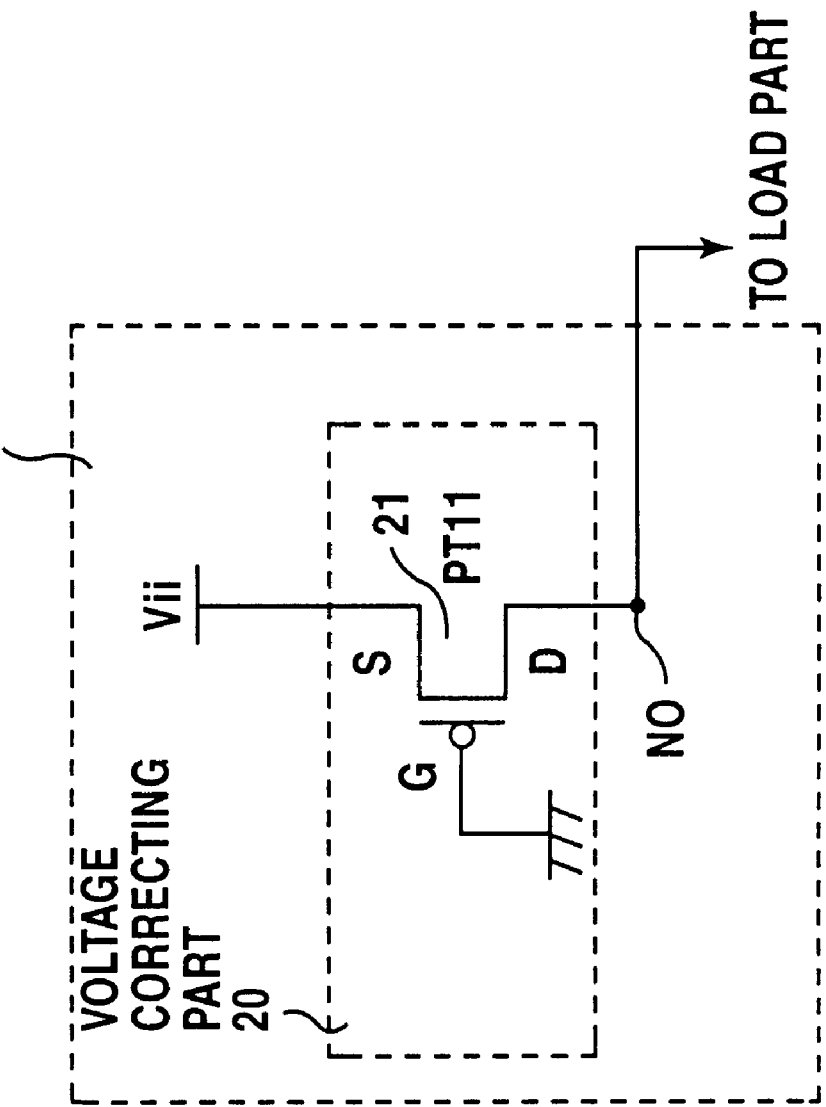
FIG. 8 is a circuit diagram of a constant-voltage source used in a voltage detecting part according to a third embodiment of the present invention.

FIG. 8 shows a construction of the constant-voltage source 10 used in a voltage detecting circuit according to a third embodiment of the present invention. In FIG. 8, parts that are the same as those shown in the previously described figures are given the same reference numbers as previously. The circuit shown in FIG. 8 utilizes, instead of the power source voltage VDD externally supplied, a power source voltage Vii generated within the semiconductor integrated circuit device. The internal power source voltage Vii is not greatly affected by noise. Further, the voltage Vii is regulated and is thus stable. The voltage Vii is applied to the source of the PMOS transistor 21, and the drain thereof is connected to the node NO. The other parts of the voltage detecting circuit according to the third embodiment of the present invention are the same as those corresponding to the first embodiment thereof.

Figure 9:
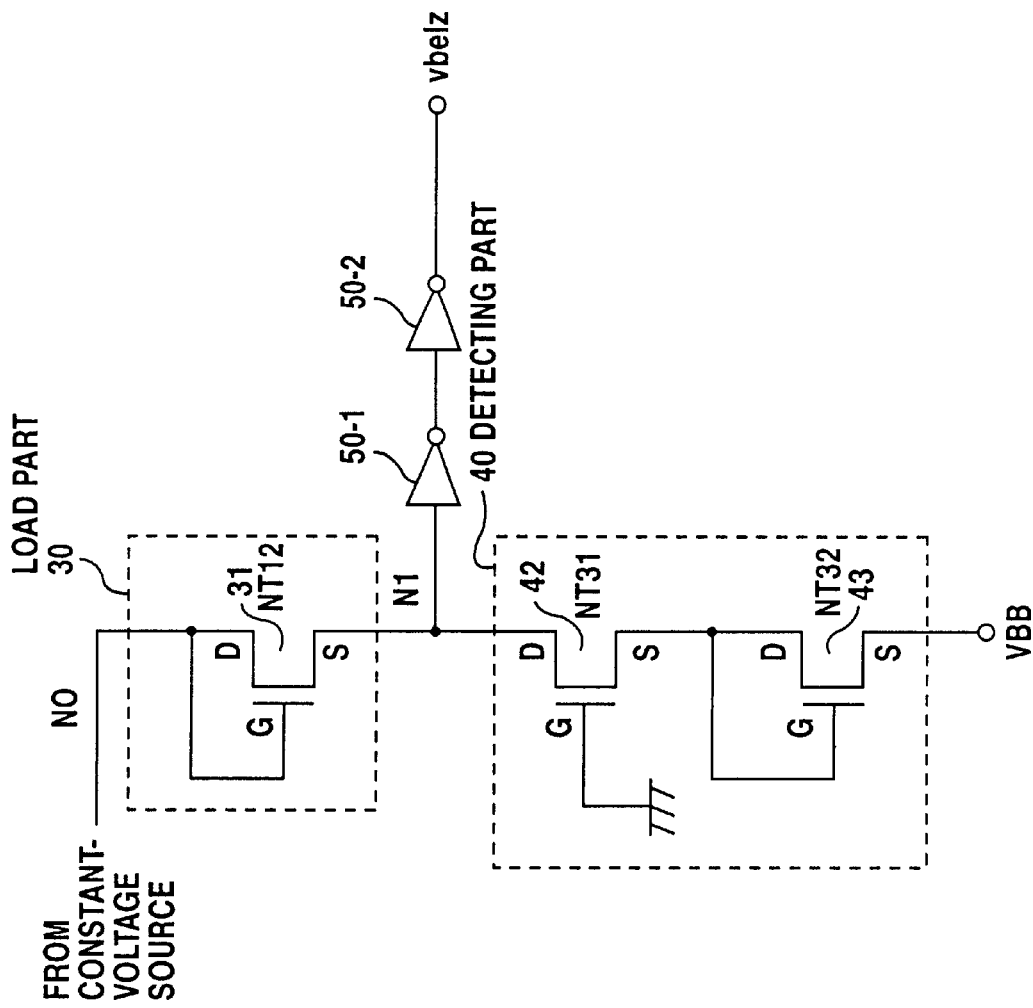
FIG. 9 is a circuit diagram of a load part and a detecting part used in a voltage detecting circuit according to a fourth embodiment of the present invention.

FIG. 9 is a circuit diagram of a construction of the detecting part 40 used in a voltage detecting circuit according to a fourth embodiment of the present invention. In FIG. 9, parts that are the same as those shown in the previously described figures are given the same reference numbers as previously. The detecting part 40 shown in FIG. 9 differs from that shown in FIG. 4 in that the detecting part 40 is made up of two NMOS transistors 42 (NT31) and 43 (NT32).

The drain of the NMOS transistor 42 is connected to the source of the NMOS transistor 31 via the node N1, and the gate of the NMOS transistor 42 is grounded. The source of the NMOS transistor 42 is connected to the drain and gate of the NMOS transistor 43. The source of the NMOS transistor 43 receives the substrate voltage VBB.

When the node N1 switches to the high level, the NOT circuit part 50-1 outputs the low-level signal. The NOT circuit part 50-2 inverts the low-level signal from the NOT circuit part 50-1 into the high-level signal. The high-level signal from the NOT circuit part 50-2 is the signal vbelz used to adjust the substrate voltage generating circuit. When the negative substrate voltage VBB is generated by the substrate voltage generating circuit, the substrate voltage VBB gradually decreases and reaches the level defined by the following expression:

$$VBB = V_{GND} - Vth \quad (3)$$

where Vth is the threshold voltage of the NMOS transistor 43. At that time, the NMOS transistor 43 is turned ON. Further, the substrate voltage VBB decreases and reached the level defined by the following expression:

$$VBB = V_{GND} - 2Vth \quad (4)$$

When the above equation stands, the NMOS transistor 42 is turned ON.

Thus, the potential of the node N1 switches to the low level when the substrate voltage VBB reaches the level defined by equation (4). Then, the output signal of the NOT circuit 50-1 is switched to the high level, which is received by the NOT circuit part 50-2. Then, the low level signal is output by the NOT circuit part 50-2 as the signal vbelz. In response to the low-level substrate voltage VBB, the substrate voltage generating circuit stops generating the declining substrate voltage VBB, which is thus adjusted so that equation (4) stands.

The other parts of the fourth embodiment of the present invention are the same as corresponding those of the first embodiment of the present invention.

As described above, the fourth embodiment of the present invention is capable of further increasing the substrate voltage VBB to be detected in the negative-side direction and thus adjusting the substrate voltage VBB more deeply in the negative-side direction.

Figure 10:
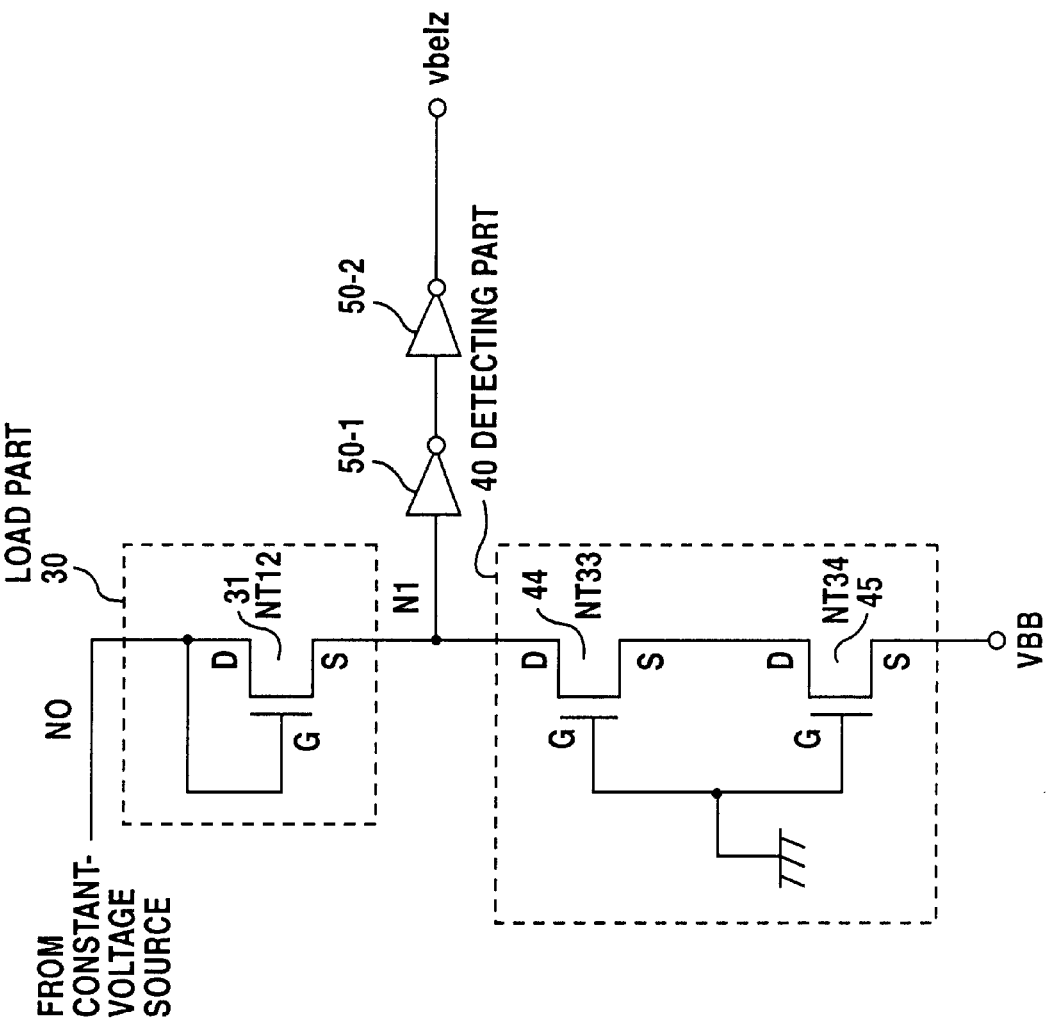
FIG. 10 is a circuit diagram of a load part and a detecting part used in a voltage detecting circuit according to a fifth embodiment of the present invention.

FIG. 10 is a circuit diagram of the load part 30 and the detecting part 40 used in a fifth embodiment of the present invention. In FIG. 10, parts that are the same as those shown in the previously described figures are given the same reference numbers as previously. The detecting part 40 shown in FIG. 10 differs from that shown in FIG. 4 in that the circuit shown in FIG. 10 is made up of two NMOS transistors 44 (NT33) and 45 (NT34).

The drain of the NMOS transistor 44 is connected to the source of the NMOS transistor 31 via the node N1, and the gate thereof is grounded. The source of the NMOS transistor 44 is connected to the drain of the NMOS transistor 45. The gate of the NMOS transistor 45 is grounded, and the source thereof is connected to the substrate voltage VBB.

When the node N1 switches to the high level, the NOT circuit part 50-1 outputs the low-level signal, which is inverted by the NOT circuit 50-2. The high-level signal output from the NOT circuit part 50-2 is used as the signal vbelz for adjusting the substrate voltage generating circuit (not shown). The substrate voltage generating circuit generates the substrate voltage VBB based on the signal vbelz.

When the signal vbelz is at the high level, the substrate voltage generating circuit generates the negative substrate voltage VBB, which gradually decreases and reaches the level defined by equation (3) described before. At that time, the NMOS transistor 45 is turned ON. The substrate voltage VBB further decreases and reaches the level defined by equation (4) described before. Then, the NMOS transistor 44 is turned ON.

Thus, the potential of the node N1 switches to the low level when the substrate voltage VBB becomes the level defined by equation (4). Then, the NOT circuit part 50-1 outputs the high-level signal, which is inverted by the NOT circuit part 50-2. The low-level signal from the NOT circuit part 50-2 is the low-level signal vbelz. In response to the low-level signal vbelz, the substrate voltage generating circuit stops generating the negative substrate voltage VBB, so that the voltage VBB is adjusted so as to satisfy equation (4).

The other parts of the fifth embodiment of the present invention are the same as corresponding those of the first embodiment of the present invention.

As described above, the fifth embodiment of the present invention is capable of further increasing the substrate voltage VBB to be detected in the negative-side direction and thus adjusting the substrate voltage VBB more deeply in the negative-side direction.

According to the present invention, the following advantages can be obtained.

The load part (which corresponds to the load part 30) and the detecting part (which corresponds to the detecting part 40) are of transistors of the same type. Thus, it is possible to cancel variations in the threshold voltages of the transistors due to variations in some factors involved in the fabricating process. This utilizes the fact that the transistors of the same type have almost the same variations. Thus, the voltage detecting circuit of the present invention can accurately detect the given voltage (the substrate voltage).

The present invention generates a detection signal based on the relationship between the given voltage to be detected and a reference voltage. The reference voltage is based on the threshold voltage of the transistor included in the detecting part. Thus, it is possible to arbitrarily adjust the voltage to be detected. For example, a plurality of transistors can be used if it is desired to increase the given voltage in the negative-side direction.

The load part is connected to the drain of a transistor forming the detecting part, and the gate thereof grounded. Further, the source of the above transistor is connected to the given voltage to be detected. Thus, it is possible to produce the detection signal based on the relationship between the given voltage and the threshold voltage of the transistor.

The present invention may include a level converting part (which corresponds to the PMOS transistor 52 and the NMOS transistor 53) which converts the level of the detection signal supplied from the detecting part, so that the level of the detection can arbitrarily be adjusted. A current adjusting part (which corresponds to the PMOS transistor 51) may be provided in the level converting part. The current adjusting part prevents an excessive current from flowing through the level converting part, so that wasteful power consumption can be avoided. The current adjusting part may be formed of a transistor having a long gate length.

A constant-voltage generating part (which corresponds to the constant-voltage source 10) may include a voltage correcting part formed of a transistor of the same type of that of the transistor forming the current adjusting part. It is thus possible to cancel variations in the threshold values of the transistors due to variations in some factors involved in the fabricating process.

The present invention is not limited to the specifically disclosed embodiments, and variations and modifications may be made without departing from the scope of the present invention.

What is claimed is:

1. A voltage detecting circuit comprising:
   a constant-voltage source;
   a load part including an n-channel MOS first transistor coupled to the constant-voltage source, the first transistor having a drain and a gate both connected to the constant-voltage source and having a source; and
   a detecting part including an n-channel MOS second transistor coupled to the first transistor of the load part, the second transistor having a drain connected to the source of the first transistor and a source to which a given voltage to be detected is applied,
   the detecting part detecting a given source-gate voltage of the second transistor.

2. The voltage detecting circuit as claimed in claim 1, wherein said detecting part generates a voltage detection signal based on a relationship between the given voltage and a reference voltage.

3. The voltage detecting circuit as claimed in claim 2, wherein the reference voltage is a threshold voltage of the second transistor.

4. The voltage detecting circuit as claimed in claim 1, further comprising a level converting part converting a level of a voltage detection signal output from the detecting part.

5. The voltage detecting circuit as claimed in claim 4, wherein the level converting part comprises:
   a level converting circuit; and a current adjustment circuit adjusting a current flowing through the level converting circuit.

6. The voltage detecting circuit as claimed in claim 5, wherein the current adjusting part includes a third transistor.

7. The voltage detecting circuit as claimed in claim 5, wherein the constant-voltage source includes a voltage correcting part having a fourth transistor of the same type as that of the third transistor.

8. The voltage detecting circuit as claimed in claim 1, wherein the constant-voltage source includes resistors and a voltage correcting part connected in series between a power source voltage and ground.

9. The voltage detecting circuit as claimed in claim 1, wherein the constant-voltage source includes a first resistor connected to a power source voltage, a third transistor having a first terminal connected to the first resistor, a second terminal, and a control terminal grounded, and a second resistor interposed between the second terminal of the third transistor and ground, the second terminal of the third transistor also being connected to the load part.

10. The voltage detecting circuit as claimed in claim 1, wherein the constant-voltage source includes a third transistor having a first terminal receiving a power source voltage, a second terminal, and a control terminal grounded, a first resistor connected to the second terminal of the third transistor, and a second resistor provided between the first resistor and ground, a node at which the first and second resistors are connected being connected to the load part.

11. A voltage detecting circuit comprising:

a first transistor having a first terminal coupled to a constant-voltage source, a second terminal connected to a first node, and a control terminal connected to the first terminal; and a second transistor having a first terminal connected to the first node, a second terminal receiving a given voltage to be detected, and a control terminal grounded, the first and second transistors being of an identical type, a voltage detection signal being obtained at the first node.

12. The voltage detecting circuit as claimed in claim 11, further comprising a level converting part converting a level of the voltage detection signal.

13. A voltage detecting circuit comprising:

a first transistor having a first terminal coupled to a constant-voltage source, a second terminal connected to a first node, and a control terminal connected to the first terminal;

a second transistor having a first terminal connected to the first node, a second terminal, and a control terminal grounded; and a third transistor having a first terminal connected to the second terminal of the second transistor, a second terminal receiving a given voltage to be detected, and a control terminal grounded, the first, second and third transistors being of an identical type, a voltage detection signal being obtained at the first node.

14. The voltage detecting circuit as claimed in claim 13, further comprising a level converting part converting a level of the voltage detection signal.

15. A voltage detecting circuit comprising:

a first transistor having a first terminal coupled to a constant-voltage source, a second terminal connected to a first node, and a control terminal connected to the first terminal;

a second transistor having a first terminal connected to the first node, a second terminal, and a control terminal grounded; and a third transistor having a first terminal connected to the second terminal of the second transistor, a second terminal receiving a given voltage to be detected, and a control terminal connected to the first terminal of the third transistor, the first, second and third transistors being of an identical type, a voltage detection signal being obtained at the first node.

16. The voltage detecting circuit as claimed in claim 15, further comprising a level converting part converting a level of the voltage detection signal.

* * * * *